United States Patent
Ban et al.

(10) Patent No.: US 10,566,350 B2
(45) Date of Patent: Feb. 18, 2020

(54) DISPLAY SUBSTRATE, METHOD OF MANUFACTURING THE SAME AND DISPLAY DEVICE

(71) Applicant: BOE TECHNOLOGY GROUP CO., LTD., Beijing (CN)

(72) Inventors: Shengguang Ban, Beijing (CN); Zhanfeng Cao, Beijing (CN); Qi Yao, Beijing (CN); Dapeng Xue, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 16/032,568

(22) Filed: Jul. 11, 2018

(65) Prior Publication Data

US 2019/0051671 A1   Feb. 14, 2019

(30) Foreign Application Priority Data

Aug. 8, 2017  (CN) .......................... 2017 1 0686624

(51) Int. Cl.
  *H01L 27/12*    (2006.01)
  *H01L 31/0216*  (2014.01)
  (Continued)

(52) U.S. Cl.
  CPC .... *H01L 27/1218* (2013.01); *G02F 1/136209* (2013.01); *H01L 27/127* (2013.01); *H01L 27/1222* (2013.01); *H01L 27/1262* (2013.01); *H01L 31/02164* (2013.01); *H01L 29/41733* (2013.01); *H01L 29/42384* (2013.01); *H01L 29/78675* (2013.01)

(58) Field of Classification Search
  CPC ................................................ G02F 1/136209
  See application file for complete search history.

(56) References Cited

U.S. PATENT DOCUMENTS 5,686,980 A * 11/1997 Hirayama ......... H01L 31/02164
                                                      349/110
6,195,140 B1 * 2/2001 Kubo ................ G02F 1/133555
                                                      349/44

(Continued)

FOREIGN PATENT DOCUMENTS

| CN | 1570683 A     | 1/2005  |
| JP | H09258200 A   | 10/1997 |
| KR | 20170080887 A | 7/2017  |

OTHER PUBLICATIONS

First Office Action dated Jun. 14, 2019; Corresponding to Chinese Application No. 201710686624.7; English Translation Attached.

*Primary Examiner* — Nicholas J Tobergte
(74) *Attorney, Agent, or Firm* — Nath, Goldberg & Meyer; Joshua B. Goldberg; Stanley N. Protigal

(57) ABSTRACT

A display substrate, a method of manufacturing the same and a display device are provided. The display substrate includes a base substrate, a plurality of metal particles dispersedly disposed on the base substrate and forming a discontinuous film, a light shielding layer disposed on a side of the base substrate on which the plurality of metal particles are disposed and covering the plurality of metal particles, and a thin film transistor located on a side of the light shielding layer far away from the base substrate.

18 Claims, 3 Drawing Sheets

(51) Int. Cl.
  *G02F 1/1362* (2006.01)
  *H01L 29/423* (2006.01)
  *H01L 29/786* (2006.01)
  *H01L 29/417* (2006.01)

(56) References Cited

U.S. PATENT DOCUMENTS

| | | | |
|---|---|---|---|
| 6,330,047 B1 * | 12/2001 | Kubo | G02F 1/133555 349/110 |
| 6,452,654 B2 * | 9/2002 | Kubo | G02F 1/133555 349/114 |
| 7,179,510 B2 * | 2/2007 | Hatakeyama | G02F 1/133512 349/106 |
| 7,306,883 B2 * | 12/2007 | Ito | G02F 1/133512 349/110 |
| 9,081,122 B2 * | 7/2015 | Shin | G02F 1/136209 |
| 9,612,492 B2 * | 4/2017 | Yang | G02F 1/133512 |
| 9,865,664 B2 * | 1/2018 | Matsubara | H01L 29/786 |
| 9,904,127 B2 * | 2/2018 | Kimura | G02F 1/134363 |
| 10,114,262 B2 * | 10/2018 | Deng | G02F 1/13439 |

* cited by examiner

DISPLAY SUBSTRATE, METHOD OF MANUFACTURING THE SAME AND DISPLAY DEVICE

CROSS-REFERENCE TO RELATED APPLICATION

This application claims priority to Chinese Patent Application No. 201710686624.7 filed on Aug. 8, 2017, the contents of which are incorporated by reference in the entirety.

TECHNICAL FIELD

The present disclosure relates to the field of display technologies, and in particular, to a display substrate, a method of manufacturing the same, and a display device.

BACKGROUND

A Thin Film Transistor (TFT) of a liquid crystal display device manufactured with Low Temperature Poly-silicon (LTPS) generally has a top gate structure, and therefore a light shielding layer needs to be provided to block backlight.

A 9-mask top gate process is generally adopted to manufacture an LTPS liquid crystal display, in which the light shielding layer is made of the metal molybdenum (Mo). Since there is a risk of discharge during chemical vapor deposition (CVD) on the entire layer of metal, it is necessary to etch the entire layer of metal to form a pattern before performing the CVD. Thus, when the light shielding layer is made of Mo, it cannot be etched with an active layer (for example, which is made of poly-silicon (p-Si)) by using a same mask. The use of amorphous-silicon (a-Si) to form a light shielding layer can solve this problem because the light shielding layer made of a-Si can be etched with the active layer made of p-Si by using a same mask, thereby reducing one mask and simplifying the previous 9-mask process as an 8-mask process. Therefore, production costs will be greatly reduced.

SUMMARY

A display substrate is provided in an aspect of present disclosure, the display substrate including:
a base substrate;
a plurality of metal particles dispersedly disposed on the base substrate and forming a discontinuous film;
a light shielding layer disposed on a side of the base substrate on which the plurality of metal particles are disposed and covering the plurality of metal particles; and
a thin film transistor located on a side of the light shielding layer far away from the base substrate.

In an embodiment, each of the plurality of metal particles has a spherical or spheroidal shape, and has a size in a range of approximately 10 nm to 100 nm.

In an embodiment, a distance between any two adjacent ones of the plurality of metal particles falls within a range of approximately 100 nm to 300 nm.

In an embodiment, a material used to form each of the metal particles includes Au, Ag, Cu, Pt or Al.

In an embodiment, the display substrate further includes a first buffer layer disposed between the base substrate and the plurality of metal particles.

In an embodiment, a material of the light shielding layer is a semiconductor material.

In an embodiment, the material of the light shielding layer is amorphous silicon.

In an embodiment, a projection of the light shielding layer on the base substrate covers projections of the plurality of metal particles on the base substrate.

In an embodiment, the light shielding layer has a thickness of about 500 Å to 1500 Å.

In an embodiment, the display substrate further includes a second buffer layer between the light shielding layer and the thin film transistor.

In an embodiment, the thin film transistor has a top gate structure.

A display device is provided in another aspect of the present disclosure, the display device including the display substrate described above and an opposite substrate disposed opposite to the display substrate.

A method of manufacturing a display substrate is provided in another aspect of the present disclosure, the method including:
forming a plurality of metal particles, a light shielding layer and a thin film transistor on a base substrate sequentially, wherein:
the plurality of metal particles are dispersedly disposed on the base substrate and form a discontinuous film;
the light shielding layer is disposed on a side of the base substrate on which the plurality of metal particles are disposed and covers the plurality of metal particles; and
the thin film transistor is located on a side of the light shielding layer far away from the base substrate.

In an embodiment, the method of manufacturing a display substrate further including: forming a first buffer layer on the base substrate, wherein the plurality of metal particles are formed on the first buffer layer, and the light shielding layer is formed on a side of the first buffer layer on which the plurality of metal particles are disposed and covers the plurality of metal particles.

In an embodiment, the method of manufacturing a display substrate further including forming a second buffer layer on the light shielding layer, wherein:
the thin film transistor is formed on a side of the second buffer layer far away from the base substrate and includes an active layer, a gate electrode, and source/drain electrodes, and
the light shielding layer, the second buffer layer, and the active layer are formed by one patterning process.

In an embodiment, the plurality of metal particles are formed by a sputtering deposition process under the following conditions: a deposition power of about 300 W to 700 W, a pressure of about 0.2 Pa to 0.5 Pa, a flow rate of argon of about 50 sccm to 150 sccm, the scanning being performed less than 5 times, and a deposition temperature of about 80° C. to 120° C.

In an embodiment, each of the metal particles is made of Au, Ag, Cu, Pt or Al.

In an embodiment, the light shielding layer is made of a semiconductor material.

DETAILED DESCRIPTION

The light shielding layer in the prior art is made of the material a-Si. However, since the light transmittance of a-Si is relatively high, the use of a-Si to form a light shielding layer reduces the stability and display effect of the thin film transistor in the LTPS display device.

In the present disclosure, a plurality of metal particles are deposited on a buffer layer before the light shielding layer made of a-Si is deposited, and the absorption of the backlight by the a-Si light shielding layer may be enhanced through the plasmon polariton effect which may be generated on the surfaces of the metal particles, thereby the stability of the device may be increased.

In order for those skilled in the art to better understand the technical solutions of the present disclosure, the display substrate, the manufacturing method thereof and the display device provided by the present disclosure are described in detail below with reference to the accompanying drawings.

Figure 1:
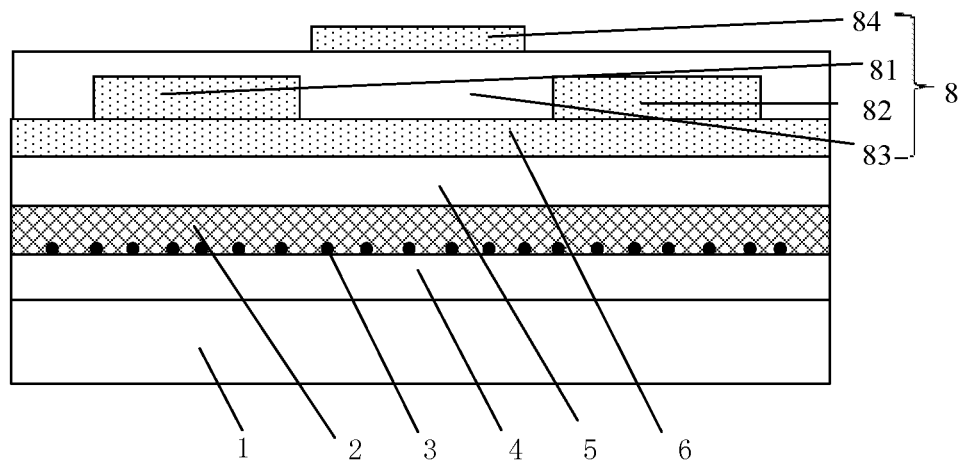
FIG. 1 is a schematic structure diagram of a display substrate in accordance with an embodiment of the present disclosure.

FIG. 1 is a schematic structure diagram of a display substrate in accordance with an embodiment of the present disclosure. As shown in FIG. 1, the display substrate includes a base substrate 1, a plurality of metal particles 3 disposed on the base substrate 1, a light shielding layer 2, and a thin film transistor, wherein the light shielding layer 2 is disposed on a side of the base substrate 1 on which the plurality of metal particles 3 are disposed and covers the plurality of metal particles 3, and the thin film transistor is located on a side of the light shielding layer 2 far away from (i.e., distal to) the base substrate 1.

In this embodiment, each of the metal particles 3 has a spherical shape. However, the shape of each of the metal particles 3 is not limited thereto. In other embodiment, each of the metal particles 3 may have a spheroidal shape such as an ellipsoidal shape. In order to bring about the plasmon polariton effect, the size of each of the metal particles 3 may not be too large or too small. That is, the maximum distance between any two points on the surface of a metal particle 3 (for example, the maximum distance between any two points of the projection of the metal particle 3 on the base substrate 1, the maximum distance between any two points in the direction perpendicular to the base substrate 1 (i.e., the thickness of the metal particle 3), etc.) may be within a first range. In this embodiment, the size of each of the metal particles 3 may fall within a range of approximately 10 nm to 100 nm depending on the material forming the metal particles 3. It is to be noted that due to the limitation of process precision, the minimum or maximum size of each of the metal particles 3 that can be formed are not necessarily exactly 10 nm or 100 nm, but can be within an allowable error range.

In this embodiment, the plurality of metal particles 3 are dispersedly disposed. It should be understood that a too small distance between any two adjacent ones of the metal particles may lead to ion aggregation and thus attenuate the plasmon polariton effect, while a too large distance between any two adjacent ones of the metal particles may not be helpful to achieve the effect of enhancing the absorption of the backlight. Therefore, the distance between any two adjacent ones of the metal particles should not be too large or too small. Specifically, the distance between any two adjacent metal particles 3 (i.e., the minimum distance between any point on the surface of one metal particle and any point on the surface of another adjacent metal particle) may be within a second range. In this embodiment, the distance between any two adjacent metal particles 3 may fall within a range of approximately 100 nm to 300 nm. It is to be noted that due to the limitation of process precision, the minimum or maximum distance between any two adjacent metal particles that can be formed are not necessarily exactly 100 nm or 300 nm, but can be within an allowable error range. Due to the dispersion arrangement of the metal particles 3, the metal particles 3 form a discontinuous film.

In this embodiment, the metal particles 3 are made of metals capable of generating a surface plasmon polariton effect. For example, the material that can be used to form the metal particles 3 may include Au, Ag, Cu, Pt or Al. In one embodiment, the metal particles 3 are made of the material Cu.

In this embodiment, the light shielding layer 2 is made of a semiconductor material. In one embodiment, the semiconductor material is a-Si. When the backlight is incident from a side of the base substrate 1 distal to the light shielding layer 2, the light shielding layer 2 can block the backlight.

In this embodiment, the light shielding layer 2 has a thickness of about 500 Å to 1500 Å. It is to be noted that due to the limitation of process precision, the minimum or maximum thickness of the light shielding layer that can be formed are not necessarily exactly 500 Å or 1500 Å, but may be within an allowable error range (for example, ±50 Å). For example, the minimum thickness of the light shielding layer actually formed may be less than 500 Å. Similarly, the maximum thickness of the light shielding layer actually formed can be greater than 1500 Å. In one embodiment, the light shielding layer 2 has a thickness of about 900 Å. As described above, the size of each of the metal particles 3 is in the range of 10 nm to 100 nm. Further, a projection of the light shielding layer 2 on the base substrate 1 covers projections of the metal particles 3 on the base substrate 1.

In another embodiment, the display substrate may further include a first buffer layer 4 disposed between the base substrate 1 and the plurality of metal particles 3. Specifically, the first buffer layer 4 is disposed on the base substrate 1, and the plurality of metal particles 3 are dispersedly disposed on the first buffer layer 4. The light shielding layer 2 is disposed on a side of the first buffer layer 4 on which the plurality of metal particles 3 are disposed and covers the plurality of metal particles 3.

In another embodiment, the display substrate may further include a second buffer layer 5, and the second buffer layer 5 is disposed on the light shielding layer 2.

In this embodiment, the thin film transistor 8 is located on the second buffer layer 5. The thin film transistor 8 includes an active layer 6, source/drain electrodes 81 and 82, and a gate electrode 84, wherein the active layer 6 is on the second buffer layer 5; the source/drain electrodes are on and connected to the active layer 6; the gate electrode is located above the source/drain electrodes with an insulating layer 83 disposed there between. In one embodiment, the material of the active layer 6 is p-Si. In another embodiment, the material of the active layer 6 is indium gallium zinc oxide (IGZO). However, the material of the active layer 6 in the present disclosure is not limited thereto.

In an embodiment, the display substrate may be an LTPS array substrate.

In this embodiment, the absorption of the backlight by the light shielding layer may be enhanced by the surface plasmon polariton effect of the metal. The essence of the surface plasmon polariton effect is that free electrons on the surfaces of the metal particles undergo collective oscillation under the excitation of an external electromagnetic field. Resonance occurs when the frequency of the free electrons is the same as that of the external electromagnetic field. Such resonance may produce many special optoelectronic effects, such as absorption and scattering of visible light and enhanced electric field near the surfaces of the metal particles, etc. In this embodiment, the backlight is incident from a side of the base substrate 1 remote from (i.e., distal to) the light shielding layer 2, and the incident backlight drives the collective movement of free electrons on the surfaces of the metal particles 3 and causes the surface electron cloud to deviate from the nucleus of the metal particles 3. At this point, the Coulomb interaction between the electron cloud and the nucleus attracts the electron cloud to move in the direction toward the nucleus. Therefore, electrons collectively oscillate in the vicinity of the nucleus, producing localized surface plasmon polariton. When the frequency of the incident backlight coincides with the oscillation frequency of the free electrons on the surfaces of the metal particles 3, resonance occurs and causes a large increase in the amplitude of the collective oscillation of the free electrons, that is, localized surface plasmon resonance occurs. Localized surface plasmon resonance results in selective resonance absorption of the incident backlight by metal nanoparticles, so that the metal particles 3 in this embodiment are capable of absorbing the incident backlight through the plasmon polariton effect.

Figure 2:
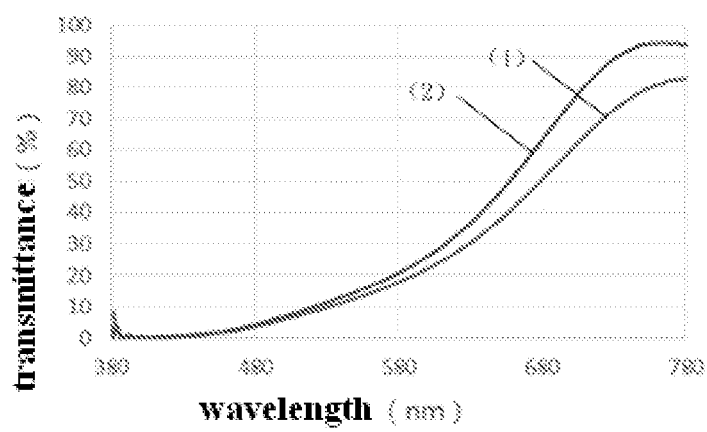
FIG. 2 is a comparison diagram of transmittances of a light shielding layer not provided with metal particles and a light shielding layer provided with metal particles in accordance with an embodiment of the present disclosure.

FIG. 2 is a comparison diagram of transmittances of a light shielding layer not provided with metal particles and the light shielding layer provided with metal particles in accordance with an embodiment of the present disclosure. As shown in FIG. 2, the curve (1) represents a curve of the transmittance of the light shielding layer 2 provided with the metal particles 3, and the curve (2) represents a curve of the transmittance of the light shielding layer 2 not provided with the metal particles 3. The thickness of the light shielding layer 2 is about 900 Å in both cases. For incident light of a given frequency, the transmittance of the light shielding layer 2 provided with the metal particles 3 is smaller than the transmittance of the light shielding layer 2 not provided with the metal particles 3. In particular, for red light (which has a wavelength in the range of 610 nm to 750 nm), the effect that the transmittance of the light shielding layer 2 provided with the metal particles 3 is smaller than the transmittance of the light shielding layer 2 not provided with the metal particles 3 is even more significant. In summary, with the metal particles 3, the absorption of the backlight by the light shielding layer 2 may be increased, thus the transmittance of the light shielding layer 2 may be reduced.

A display substrate according to this embodiment includes a base substrate, a plurality of metal particles disposed on the base substrate, a light shielding layer disposed on a side of the base substrate on which the plurality of metal particles are disposed and covering the plurality of metal particles, and a thin film transistor located on a side of the light shielding layer far away from (i.e., distal to) the base substrate. In the display substrate, the metal particles enhance the absorption of the backlight by the light shielding layer through the plasmon polariton effect, thereby improving the stability and display effect of the thin film transistor.

Another embodiment of the present disclosure provides a display device including a display substrate and an opposite substrate disposed opposite to the display substrate.

In this embodiment, the display substrate is an array substrate, for example, an LTPS array substrate; and the opposite substrate is a color film substrate.

The display device according to this embodiment may be one of a desktop computer, a tablet computer, a notebook computer, a mobile phone, a PDA, a GPS, an on-board display, a projection display, a camera, a digital camera, an electronic watch, a calculator, an electronic instrument, an instrument, an electronic paper, a TV, a monitor, a digital frame, a navigator and any other product or component with display function, and can be applied to many fields such as public display and illusory display.

A display substrate of the display device according to this embodiment includes a base substrate, a plurality of metal particles disposed on the base substrate, a light shielding layer disposed on a side of the base substrate on which the plurality of metal particles are disposed and covering the plurality of metal particles, and a thin film transistor located on a side of the light shielding layer far away from the base substrate. In the display substrate, the metal particles enhance the absorption of the backlight by the light shielding layer through the plasmon polariton effect, thereby improving the stability and display effect of the thin film transistor.

A method of manufacturing a display substrate is provided in another embodiment of the present disclosure. The method includes: forming a plurality of metal particles, a light shielding layer and a thin film transistor on a base substrate sequentially, wherein: the plurality of metal particles are dispersedly disposed on the base substrate and forming a discontinuous film; the light shielding layer is disposed on a side of the base substrate on which the plurality of metal particles are disposed and covers the plurality of metal particles; and the thin film transistor is located on a side of the light shielding layer far away from (i.e., distal to) the base substrate.

In this embodiment, the thin film transistor includes an active layer, a gate electrode, and source/drain electrodes. Forming a plurality of metal particles, a light shielding layer, and a thin film transistor on the base substrate may include the following steps 101 to 106.

Step 101: Forming a first buffer layer on the base substrate and forming a plurality of metal particles on the first buffer layer.

Figure 3A:
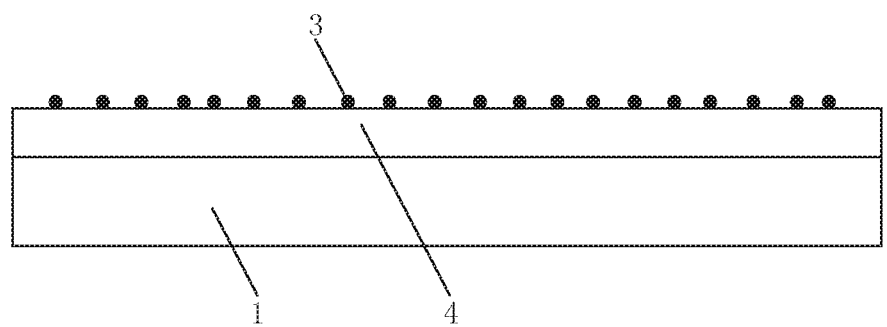
FIG. 3a is a schematic diagram of forming a first buffer layer and a plurality of metal particles in accordance with an embodiment of the present disclosure.

FIG. 3a is a schematic diagram of forming a first buffer layer and a plurality of metal particles in accordance with an embodiment of the present disclosure. As shown in FIG. 3a, a first buffer layer 4 is deposited on the base substrate 1, and a plurality of metal particles 3 are deposited on the first buffer layer 4, wherein the plurality of metal particles 3 are dispersedly disposed. In the present disclosure, the plurality of metal particles 3 are deposited through a sputtering deposition process. Specifically, the plurality of metal particles 3 are formed under the following conditions: a deposition power of about 300 W to 700 W, a pressure of about 0.2 Pa to 0.5 Pa, a flow rate of argon of about 50 sccm to 150 sccm, the scanning being performed less than 5 times, and a deposition temperature of about 80° C. to 120° C. In one embodiment, the plurality of metal particles 3 are formed by a sputtering deposition process under the condition of a deposition power of about 500 W, a pressure of about 0.3 Pa, a flow rate of argon of about 100 sccm, the scanning being performed once, and a deposition temperature of about 100° C. In this embodiment, a smaller power is applied during deposition, so that the plurality of metal particles 3 are more dispersedly distributed to form a discontinuous film, thereby avoiding the occurrence of discharge during subsequent plasma enhanced chemical vapor deposition (referred to as PECVD).

In this embodiment, the metal particles 3 are made of a material capable of generating a surface plasmon polariton effect. For example, the metal particles 3 may be made of Au, Ag, Cu, Pt or Al. In one embodiment, the metal particles 3 are made of Cu.

Step 102: Forming a light shielding material layer, a second buffer material layer, and a first active material layer sequentially on a side of the first buffer layer on which the plurality of metal particles are formed, wherein the light shielding material layer covers the plurality of metal particles.

Figure 3B:
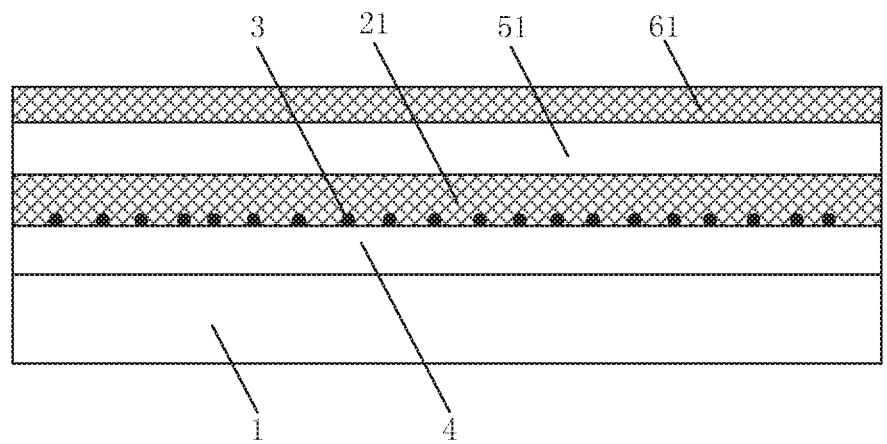
FIG. 3b is a schematic diagram of forming a light shielding material layer, a second buffer material layer, and a first active material layer in accordance with an embodiment of the present disclosure.

FIG. 3b is a schematic diagram of forming a light shielding material layer, a second buffer material layer, and a first active material layer in accordance with an embodiment of the present disclosure. As shown in FIG. 3b, a light shielding material layer 21, a second buffer material layer 51, and a first active material layer 61 may be sequentially formed on a side of the first buffer layer 4 on which the plurality of metal particles 3 are formed, wherein the light shielding material layer 51 covers the plurality of metal particles 3. The deposition process in step 102 is a PECVD process, and the deposition is performed in a PECVD chamber. Since the plurality of metal particles 3 do not form a continuous film, the risk of discharge by the metal particles 3 will not occur in the PECVD chamber.

In this embodiment, the light shielding material layer 21 is made of a semiconductor material. In one embodiment, the semiconductor material is a-Si. When the backlight is incident from a side of the base substrate 1 remote from (i.e., distal to) the light shielding material layer 21, the light shielding material layer 21 can block the backlight.

In this embodiment, the light shielding material layer 21 has a thickness of about 500 Å to 1500 Å. In one embodiment, the light shielding material layer 21 has a thickness of about 900 Å.

Step 103: Crystallizing the first active material layer to form a second active material layer.

Figure 3C:
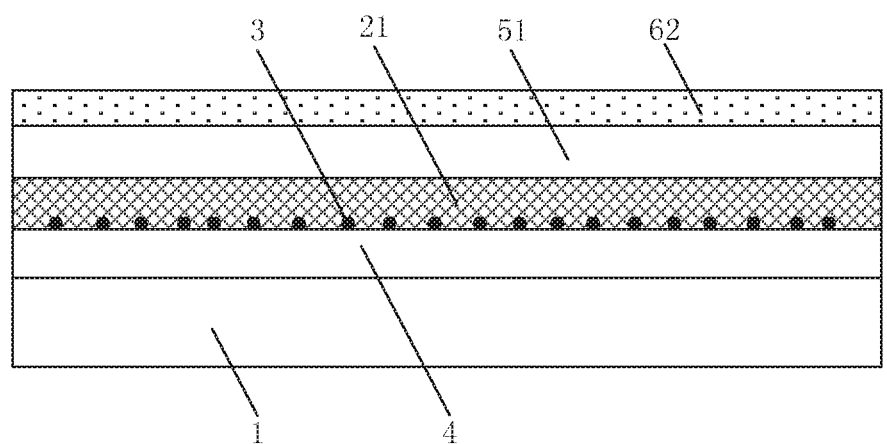
FIG. 3c is a schematic diagram of forming a second active material layer in accordance with an embodiment of the present disclosure.

FIG. 3c is a schematic diagram of forming a second active material layer in accordance with an embodiment of the present disclosure. As shown in FIG. 3c, the first active material layer 61 is subjected to an Excimer Laser Annealing (ELA) process to form a second active material layer 62. In one embodiment, the material of the first active material layer 61 is a-Si, and the material of the second active material layer 62 is p-Si.

Step 104: Patterning the light shielding material layer, the second buffer material layer and the second active material layer to form a light shielding layer, a second buffer layer and an active layer.

Figure 3D:
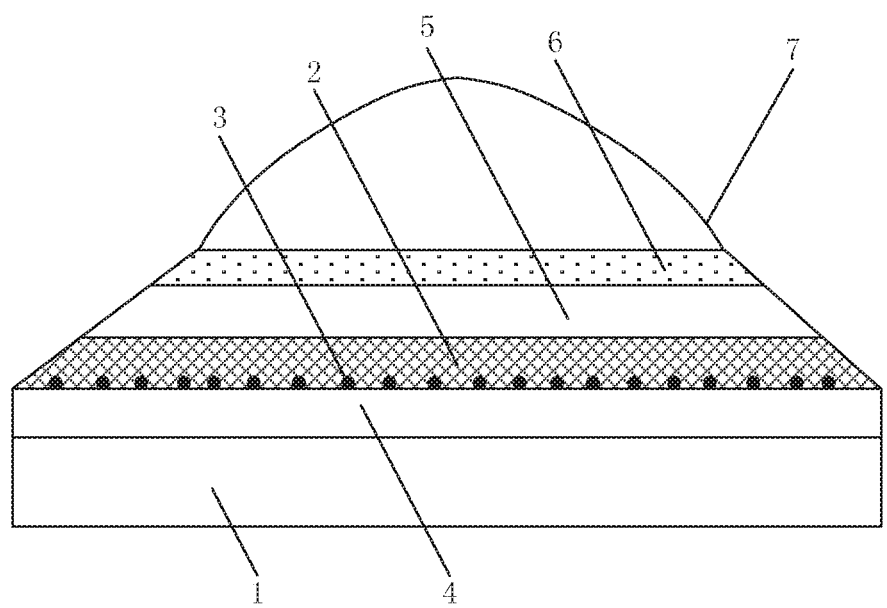
FIG. 3d is a schematic diagram of forming a light shielding layer, a second buffer layer, and an active layer in accordance with an embodiment of the present disclosure.

FIG. 3d is a schematic diagram of forming a light shielding layer, a second buffer layer, and an active layer in accordance with an embodiment of the present disclosure. In this embodiment, the light shielding layer, the second buffer layer, and the active layer are formed by one patterning process. As shown in FIG. 3d, a photoresist 7 is coated on the second active material layer 62 and then exposed and developed, so that the second active material layer 62 not covered by the photoresist and the second butler material layer 51 and the light shielding material layer 21 located below the second active material layer 62 not covered by the photoresist are etched to form the light shielding layer 2, the second buffer layer 5, and the active layer 6, respectively.

Thereafter, the photoresist 7 is removed, and the light shielding layer 2, the second buffer layer 5, and the active layer 6 are left as shown in FIG. 1.

Step 105: Forming source/drain electrodes (not shown) on the active layer, so that the source/drain electrodes are connected to the active layer.

Step 106, Forming a gate electrode (not shown) over the sours/drain electrodes.

A display substrate manufactured by the method according to this embodiment includes a base substrate, a plurality of metal particles disposed on the base substrate, a light shielding layer disposed on a side of the base substrate on which the plurality of metal particles are disposed and covering the plurality of metal particles, and a thin film transistor located on a side of the light shielding layer far away from the base substrate. In the display substrate, the metal particles enhance the absorption of the backlight by the light shielding layer through the plasmon polariton effect, thereby improving the stability and display effect of the thin film transistor.

It is to be understood that the above embodiments are merely exemplary embodiments employed to explain the principles of the present disclosure, but the present disclosure is not limited thereto. Various modifications and improvements can be made by those skilled in the art without departing from the spirit and scope of the invention, and such modifications and improvements are also considered to fall within the scope of the present disclosure.

What is claimed is:

1. A display substrate, comprising:
    a base substrate;
    a plurality of metal particles dispersedly disposed on the base substrate and forming a discontinuous film;
    a light shielding layer disposed on a side of the base substrate on which the plurality of metal particles are disposed and covering the plurality of metal particles; and
    a thin film transistor located on a side of the light shielding layer far away from the base substrate.

2. The display substrate of claim 1, wherein each of the plurality of metal particles has a spherical or spheroidal shape, and has a size in a range of approximately 10 nm to 100 nm.

3. The display substrate of claim 1, wherein a distance between any two adjacent ones of the plurality of metal particles falls within a range of approximately 100 nm to 300 nm.

4. The display substrate of claim 1, wherein a material used to form each of the metal particles comprises Au, Ag, Cu, Pt or Al.

5. The display substrate of claim 1, further comprising a first buffer layer disposed between the base substrate and the plurality of metal particles.

6. The display substrate of claim 1, wherein a material of the light shielding layer is a semiconductor material.

7. The display substrate of a claim 6, wherein the material of the light shielding layer is amorphous silicon.

8. The display substrate of claim 1, wherein a projection of the light shielding layer on the base substrate covers projections of the plurality of metal particles on the base substrate.

9. The display substrate of claim 1, wherein the light shielding layer has a thickness of about 500 Å to 1500 Å.

10. The display substrate of claim 1, further comprising a second buffer layer between the light shielding layer and the thin film transistor.

11. The display substrate of claim 1, wherein the thin film transistor has a top gate structure.

12. A display device, comprising the display substrate of claim 1.

13. A method of manufacturing a display substrate, comprising:
- forming a plurality of metal particles, a light shielding layer and a thin film transistor on a base substrate sequentially, wherein:
- the plurality of metal particles are dispersedly disposed on the base substrate and form a discontinuous film;
- the light shielding layer is disposed on a side of the base substrate on which the plurality of metal particles are disposed and covers the plurality of metal particles; and
- the thin film transistor is located on a side of the light shielding layer far away from the base substrate.

14. The method of manufacturing a display substrate according to claim 13, further comprising: forming a first buffer layer on the base substrate, wherein the plurality of metal particles are formed on the first buffer layer, and the light shielding layer is formed on a side of the first buffer layer on which the plurality of metal particles are disposed and covers the plurality of metal particles.

15. The method of manufacturing a display substrate according to claim 13, further comprising forming a second buffer layer on the light shielding layer, wherein:
- the thin film transistor is formed on a side of the second buffer layer far away from the base substrate and comprises an active layer, a gate electrode, and source/drain electrodes, and
- the light shielding layer, the second buffer layer, and the active layer are formed by one patterning process.

16. The method of manufacturing a display substrate according to claim 13, wherein the plurality of metal particles are formed by a sputtering deposition process under the following conditions: a deposition power of about 300 W to 700 W, a pressure of about 0.2 Pa to 0.5 Pa, a flow rate of argon of about 50 sccm to 150 sccm, the scanning being performed less than 5 times, and a deposition temperature of about 80 ° C. to 120 ° C.

17. The method of manufacturing a display substrate according to claim 13, wherein each of the metal particles is made of Au, Ag, Cu, Pt or Al.

18. The method of manufacturing a display substrate according to claim 13, wherein the light shielding layer is made of a semiconductor material.

* * * * *